United States Patent
Noda et al.

(10) Patent No.: US 8,294,194 B2
(45) Date of Patent: Oct. 23, 2012

(54) NONVOLATILE SEMICONDUCTOR MEMORY DEVICE AND MANUFACTURING METHOD OF THE SAME

(75) Inventors: Mitsuhiko Noda, Yokohama (JP); Hidenobu Nagashima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 13/052,465

(22) Filed: Mar. 21, 2011

(65) Prior Publication Data
US 2012/0126302 A1 May 24, 2012

(30) Foreign Application Priority Data
Nov. 18, 2010 (JP) ................... 2010-258011

(51) Int. Cl.
*H01L 21/76* (2006.01)
*H01L 29/788* (2006.01)
(52) U.S. Cl. ........ 257/316; 257/208; 257/305; 257/324; 257/513; 438/197; 438/319; 438/411; 438/421
(58) Field of Classification Search ............... 438/197, 438/319, 411, 421; 257/208, 305, 316, 324, 257/513, E29.127
See application file for complete search history.

(56) References Cited

U.S. PATENT DOCUMENTS

| | | | |
|---|---|---|---|
| 6,353,242 B1 * | 3/2002 | Watanabe et al. | 257/316 |
| 7,045,849 B2 * | 5/2006 | Chen et al. | 257/314 |
| 7,704,830 B2 * | 4/2010 | Rao et al. | 438/257 |
| 7,868,376 B2 * | 1/2011 | Aoyama et al. | 257/324 |
| 8,129,264 B2 * | 3/2012 | Kim et al. | 438/619 |
| 2007/0096202 A1 * | 5/2007 | Kang et al. | 257/324 |
| 2007/0184615 A1 * | 8/2007 | Brazzelli et al. | 438/266 |
| 2008/0003724 A1 * | 1/2008 | Cho et al. | 438/142 |

FOREIGN PATENT DOCUMENTS

JP 2009-194305 8/2009

OTHER PUBLICATIONS

U.S. Appl. No. 13/358,633, filed Jan. 26, 2011, Noda.

* cited by examiner

*Primary Examiner* — Jarrett Stark
*Assistant Examiner* — Nicholas Tobergte
(74) *Attorney, Agent, or Firm* — Oblon, Spivak, McClelland, Maier & Neustadt, L.L.P.

(57) ABSTRACT

According to one embodiment, a nonvolatile semiconductor memory device includes memory transistors, an interlayer insulating film, a peripheral transistor and a sidewall. The memory transistors are formed on a semiconductor substrate. Each of the memory transistors includes a first stack gate which includes a floating gate electrode, a second gate insulating film, and a control gate electrode. The interlayer insulating film is formed between the first stack gates. The interlayer insulating film includes a first air gap. The peripheral transistor is formed on the substrate. The peripheral transistor includes a second stack gate which includes a first gate electrode, a third gate insulating film, and a second gate electrode. The sidewall is formed on a side surface of the second stack gate and includes a second air gap. An upper end of the second air gap is located at a position lower than the third gate insulating film.

19 Claims, 9 Drawing Sheets

NONVOLATILE SEMICONDUCTOR MEMORY DEVICE AND MANUFACTURING METHOD OF THE SAME

CROSS-REFERENCE TO RELATED APPLICATIONS

This application is based upon and claims the benefit of priority from Japanese Patent Application No. 2010-258011, filed Nov. 18, 2010; the entire contents of which are incorporated herein by reference.

FIELD

Embodiments described herein relate generally to a nonvolatile semiconductor memory device and a manufacturing method of the same.

BACKGROUND

Nonvolatile semiconductor memory devices, such as a NAND-type flash memory, structured to have a floating gate as a charge storage layer have increased in application, and are thus requested to perform higher-speed data writing, reading, and erasing. Accordingly, a peripheral transistor circuit in the NAND-type flash memory needs to achieve a high speed. That is, it is necessary reduce a delay time in the peripheral transistor circuit.

The delay time in the peripheral transistor circuit is determined by the parasitic resistance or capacitance of transistors or wiring lines provided in the peripheral transistor circuit. Conventionally, a silicon oxide film or a silicon nitride film is used for a gate sidewall insulating film of the transistor. The relative dielectric constant of the silicon oxide film is about 3.9, and the relative dielectric constant of the silicon nitride film is about 7.0.

The transistors constituting the peripheral transistor circuit respectively have, as parasitic capacitances of the transistors, a capacitance between a gate and a diffusion layer, and a capacitance between a gate and a diffusion layer electrode (contact plug). Since the silicon oxide films or silicon nitride films are disposed between the gate and the diffusion layer and between the gate and the diffusion layer electrode, the parasitic capacitances of the transistors are increased. It is therefore important to reduce these parasitic components to reduce the delay time.

DETAILED DESCRIPTION

Hereinafter, a nonvolatile semiconductor memory device according to embodiments will be described with reference to the drawings. Here, a NAND-type flash memory is shown as an example of the nonvolatile semiconductor memory device. Like reference signs are provided to components having like functions and configurations in the following description, and repeated explanations are given only when necessary.

In general, according to one embodiment, a nonvolatile semiconductor memory device includes first memory cell transistors, an interlayer insulating film, a first peripheral transistor and a first sidewall insulating film.

The first memory cell transistors are formed on a semiconductor substrate at predetermined intervals. Each of the first memory cell transistors includes a first stack gate which includes a first floating gate electrode, a second gate insulating film, and a first control gate electrode that are stacked in order on a first gate insulating film disposed on the semiconductor substrate.

The interlayer insulating film is formed between the first stack gates. The interlayer insulating film includes a first air gap.

The first peripheral transistor is formed on the semiconductor substrate. The first peripheral transistor includes a second stack gate which includes a first gate electrode, a fourth gate insulating film, and a second gate electrode that are stacked in order on a third gate insulating film disposed on the semiconductor substrate.

The first sidewall insulating film is formed on a side surface of the second stack gate of the first peripheral transistor. The second sidewall insulating film includes a second air gap.

An upper end of the second air gap of the first sidewall insulating film is located at a position lower than the fourth gate insulating film.

[1] First Embodiment

A NAND-type flash memory according to a first embodiment is described.

(1) Structure According to the First Embodiment

The NAND-type flash memory comprises a memory cell array region where a memory cell transistor (hereinafter, memory cell) is formed, and a peripheral circuit region where a peripheral circuit for performing writing, reading, and erasing in the memory cell is formed.

The memory cell array region has NAND cell units. Each NAND cell unit has the memory cells connected in series, and a source select gate transistor and a drain select gate transistor that are connected to both ends of the memory cells across the memory cells. The NAND cell units are arranged in matrix form so that the source select gate transistors of the NAND cell units adjoin each other and the drain select gate transistors of the NAND cell units adjoin each other. Hereinafter, the source select gate transistors and the drain select gate transistors are referred to as select gate transistors.

The peripheral circuit region has the peripheral circuit that includes a transistor (hereinafter, peripheral transistor) for performing writing, reading, and erasing in the memory cell.

(1-1) Memory Cell Transistor and Select Gate Transistor

Figure 1A:
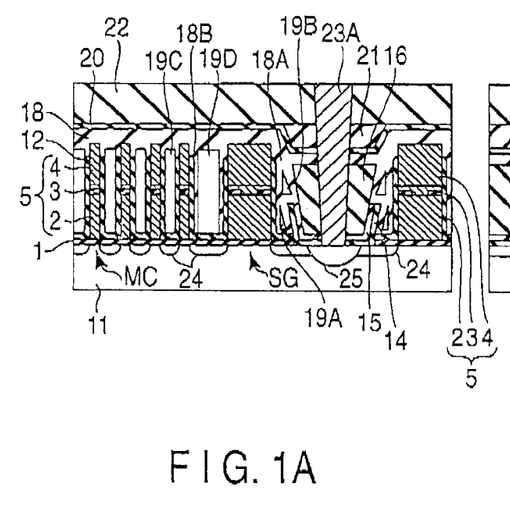
FIGS. 1A and 1B are sectional views showing the structure of a NAND-type flash memory according to a first embodiment.

FIG. 1A is a sectional view showing the structures of a memory cell transistor MC and a select gate transistor SG in the NAND-type flash memory according to the first embodiment.

As shown in FIG. 1A, a gate insulating film (tunnel oxide film) 1 is formed on a semiconductor substrate 11. Stack gates 5 of the memory cells MC and a stack gate 5 of the select gate transistor SG that constitute a first NAND cell unit are formed on the gate insulating film 1. The stack gates 5 of the memory cell transistors MC are arranged at predetermined intervals. The stack gate 5 of the select gate transistor SG is disposed adjacent to the end stack gate among the stack gates 5 of the memory cells MC.

Furthermore, on the semiconductor substrate 11, a second NAND cell unit is disposed adjacent to the first NAND cell unit. The stack gate of the select gate transistor SG that constitutes the second NAND cell unit is disposed adjacent to the stack gate of the select gate transistor SG that constitutes the first NAND cell unit.

The stack gate 5 of the memory cell MC has a floating gate electrode 2, an inter-gate insulating film 3, and a control gate electrode 4 that are formed on the gate insulating film 1 in order. The inter-gate insulating film 3 is disposed between the floating gate electrode 2 and the control gate electrode 4. The control gate electrode 4 has a silicide layer on its top.

The stack gate 5 of the select gate transistor SG has a first gate electrode 2, an inter-gate insulating film 3, and a control gate electrode 4 that are formed on the gate insulating film 1 in order. The inter-gate insulating film 3 is disposed between the first gate electrode 2 and the control gate electrode 4. The control gate electrode 4 has a silicide layer on its top. In the stack gate 5 of the select gate transistor SG, the inter-gate insulating film 3 has an opening through which the first gate electrode 2 and the control gate electrode 4 are electrically connected to each other.

Low-concentration diffusion layers 24 are formed on the semiconductor substrate 11 between the stack gates 5 of the memory cells MC (hereinafter referred to as between the memory cells MC) and on the semiconductor substrate 11 between the stack gate 5 of the memory cell MC and the stack gate 5 of the select gate transistor SG (hereinafter referred to as between the memory cell MC and the select gate transistor SG). Moreover, a low-concentration diffusion layer 24 and a high-concentration diffusion layer 25 are formed in the semiconductor substrate 11 between the stack gates of the select gate transistors SG (hereinafter referred to as between the select gate transistors SG). The diffusion layer 25 is formed on the semiconductor substrate 11 adjacent to the stack gate 5 of the select gate transistor SG.

A first liner film 14 made of, for example, tetraethylorthosilicate (TEOS), and a second liner film 15 made of, for example, a silicon nitride film are formed on the semiconductor substrate 11 between the select gate transistors SG. An interlayer insulating film 16 is formed on the second liner film 15.

A silicon oxide film 12 is formed on the side surfaces of the stack gates of the memory cell and the select gate transistor SG. An interlayer insulating film 18 made of TEOS and having air gaps (or voids) 19A, 19B, 19C, and 19D is formed on the silicon oxide film 12, on the control gate electrode 4, and on the interlayer insulating film 16.

The air gaps may not be completely surrounded by the interlayer insulating film 18. For example, when the air gap is formed by the interlayer insulating film 18 and some other insulating film, for example, the second liner film 15, the interlayer insulating film 18 is also defined as having the air gap. Moreover, the silicon oxide film 12, the first liner film 14, and the interlayer insulating film 18 may not be distinguished in, for example, SEM observation or TEM observation. That is, the two air gaps 19A and 19B surrounded by an insulating film including the interlayer insulating film 18 have only to be located on the side surface of the stack gate of the select gate transistor SG.

The air gap 19C is formed between the memory cells MC, and the air gap 19D is formed between the memory cell MC and the select gate transistor SG. Further, the air gaps 19A and 19B are formed between the stack gate of the select gate transistor SG and the first liner film 14 as well as the interlayer insulating film 16.

That is, a sidewall insulating film 18A having the air gaps 19A and 19B is formed on the side surface of the stack gate between the select gate transistors SG. The sidewall insulating film 18A has the two air gaps 19A and 19B. The air gap 19A is formed in the sidewall insulating film 18A between the gate insulating film 1 and the inter-gate insulating film 3. The air gap 19B is formed in the sidewall insulating film 18A above the air gap 19A (or above the second liner film 15). Moreover, a sidewall insulating film 18B having the air gaps 19C and 19D is formed between the memory cells MC and between the memory cell MC and the select gate transistor SG.

The upper end of the air gap 19A is located lower than the inter-gate insulating film 3. The air gap 19A is formed between the first gate electrode 2 of the select gate transistor SG and the second liner film 15. That is, the second liner film 15 is disposed between a contact plug 23A and the air gap 19A. Between the air gap 19A and the semiconductor substrate 11, the interlayer insulating film 18, the first liner film 14, and the gate insulating film 1 are disposed, and there is no second liner film 15. That is, there is no film having a large amount of trapped charges, for example, silicon nitride film between the air gap 19A and the semiconductor substrate 11. As a result, a parasitic capacitance between the select gate transistor SG and the semiconductor substrate 11 can be further reduced.

The air gap 19B is located substantially above the air gap 19A via the interlayer insulating film 18, and adjoins the control gate electrode 4 of the select gate transistor SG. The upper end of the air gap 19B is lower than the upper surface of the control gate electrode 4 and higher than the inter-gate insulating film 3. The upper end of the air gap 19B is also located substantially as high as the upper surface of the interlayer insulating film 16. In a direction traversing the select gate transistors SG, the width of the air gap 19S is greater than the width of the air gap 19A. Moreover, in the direction traversing the select gate transistors SG, the center of the air gap 19B may be off the center of the air gap 19A.

The air gap 19C is located between the control gate electrodes 4 and between the floating gate electrodes 2 in the memory cells MC. That is, the height (a direction in which the floating gate electrode 2 and the control gate electrode 4 are stacked) of the air gap 19C is greater than the heights of the air gaps 19A and 19B. As a result, a parasitic capacitance between the memory cells MC can be effectively reduced.

The air gap 19D is located between the control gate electrodes 4 and between the first gate electrodes 2 in the memory cell MC and the select gate transistor SG. That is, the height (a direction in which the floating gate electrode 2 and the control gate electrode 4 are stacked) of the air gap 19D is greater than the heights of the air gaps 19A and 19B. As a result, an electric field directed from the select gate transistor SG to the memory cell MC can be effectively weakened.

A silicon nitride film 20 is formed on the interlayer insulating film 18 having the air gaps 19C and 19D. An interlayer insulating film 21 is formed on the silicon nitride film 20 between the select gate transistors SG. Further, an interlayer insulating film 22 is formed on the silicon nitride film 20 and on the interlayer insulating film 21.

Moreover, the contact plug 23A is formed on the diffusion layer 25 between the select gate transistors SG. The contact plug 23A is electrically connected to the diffusion layer 25.

(1-2) Peripheral Transistor

Figure 1B:
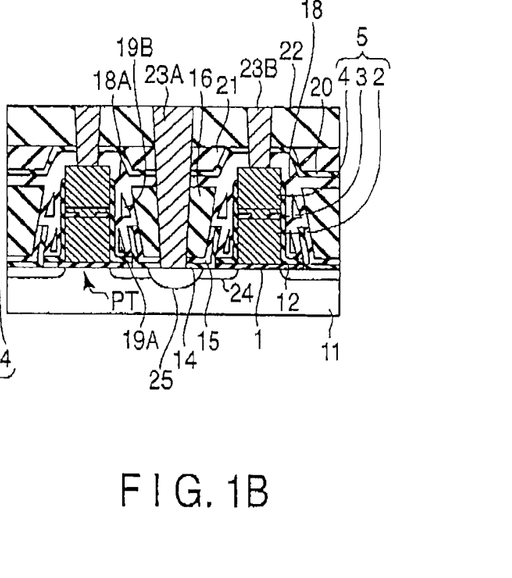

FIG. 1B is a sectional view showing the structure of the peripheral transistor in the NAND-type flash memory according to the first embodiment.

As shown in FIG. 1B, a gate insulating film 1 is formed on a semiconductor substrate 11. Stack gates 5 of peripheral transistors PT that constitute the peripheral circuit are formed on the gate insulating film 1.

The stack gate 5 of the peripheral transistor PT has a first gate electrode 2, an inter-gate insulating film 3, and a control gate electrode 4 that are formed on the gate insulating film 1 in order. The inter-gate insulating film 3 is disposed between the first gate electrode 2 and the control gate electrode 4. The control gate electrode 4 has a silicide layer on its top. In the stack gate 5 of the peripheral transistor PT, the inter-gate insulating film 3 has an opening through which the first gate electrode 2 and the control gate electrode 4 are electrically connected to each other.

A low-concentration diffusion layer 24 and a high-concentration diffusion layer 25 are formed in the semiconductor substrate 11 on both sides of the peripheral transistor PT. The diffusion layer 25 is formed on the semiconductor substrate 11 adjacent to the stack gate 5 of the peripheral transistor PT. A contact plug 23A is formed on the diffusion layer 25.

A first liner film 14 and a second liner film 15 are formed on the semiconductor substrate 11 between stack gates of the peripheral transistor PT (hereinafter referred to as between the peripheral transistors). In other words, the first liner film 14 is formed on the sidewall insulating film 18A and on the diffusion layer 25. An interlayer insulating film 16 is formed on the second liner film 15.

A silicon oxide film 12 is formed on the side surface of the stack gate of the peripheral transistor FT. An interlayer insulating film 18 having air gaps 19A and 19B is formed on the silicon oxide film 12, on the control gate electrode 4, and on the interlayer insulating film 16. The air gaps 19A and 19B are formed between the stack gate of the peripheral transistor PT and the first liner film 14 as well as the interlayer insulating film 16.

That is, a sidewall insulating film 18A having the air gaps 19A and 19B is formed on the side surface of the stack gate between the peripheral transistors PT. The sidewall insulating film 18A has the two air gaps 19A and 19B. The air gap 19A is formed in the sidewall insulating film 18A between the gate insulating film 1 and the inter-gate insulating film 3. The air gap 19B is formed in the sidewall insulating film 18A above the air gap 19A (or above the second liner film 15). The upper end of the air gap 19A is located at a position lower than the upper end of the first liner film 14. The upper end of the air gap 19B is located at a position higher than the upper end of the first liner film 14. A silicon oxide film occupies a region between the semiconductor substrate 11 and the lower end of the air gap 19A of the sidewall insulating film 18A.

The air gaps 19A and 19B formed in the side surface of the stack gate of the select gate transistor SG and the air gaps 19A and 19B formed in the side surface of the stack gate between the peripheral transistors PT have similar structures.

A silicon nitride film 20 is formed on the interlayer insulating film 18. An interlayer insulating film 21 is formed on the silicon nitride film 20 between the peripheral transistors PT. Further, an interlayer insulating film 22 is formed on the silicon nitride film 20 and on the interlayer insulating film 21.

A contact plug 23B is formed on the control gate electrode 4 of the peripheral transistor PT. The contact plug 23B is electrically connected to the control gate electrode 4.

In the first embodiment, the sidewall insulating film 18A having the air gaps 19A and 19B is formed on the side surface of the stack gate 5 of the peripheral transistor PT. That is, as the air gaps are formed in the gate sidewall insulating film of the peripheral transistor PT, a parasitic capacitance between the stack gate 5 and the diffusion layers 24 and 25 can be reduced. Consequently, the operation in the peripheral circuit, that is, the operation of writing, reading, and erasing data in the memory cell transistor MC can be increased in speed.

Furthermore, the sidewall insulating film 18A having the air gaps 19A and 19B is formed on the side surface of the stack gate 5 of the select gate transistor SG. That is, as the air gaps are formed in the gate sidewall insulating film of the select gate transistors SG, a parasitic capacitance between the stack gate 5 and the diffusion layers 24 and 25 and a parasitic capacitance between the stack gate 5 and the contact plug 23A can be reduced. Consequently, the operation of writing, reading, and erasing data in the memory cell transistor MC can be increased in speed.

Still further, there are two air gaps: the air gap 19A formed in the side surface of the floating gate electrode 2 included in the stack gate 5 of the select gate transistor SG, and the air gap 19B formed in the side surface of the control gate electrode 4. Thus, the parasitic capacitance can be considerably reduced.

Moreover, the sidewall insulating film 18B having the air gaps 19C and 19D is formed on the side surface of the stack gate 5 of the memory cell transistor MC. That is, as the air gaps are formed between the stack gates of the memory cell transistor MC, a parasitic capacitance between the stack gates 5 and a parasitic capacitance between the stack gate 5 and the diffusion layer 24 can be reduced. Consequently, the operation of writing, reading, and erasing data in the memory cell transistor MC can be increased in speed.

(2) Manufacturing Method According to the First Embodiment

FIGS. 2A to 2F, FIGS. 3A to 3F, and FIGS. 4A to 4F are sectional views showing a method of manufacturing the NAND-type flash memory according to the first embodiment. FIG. 2A, FIG. 2C, FIG. 2E, FIG. 3A, FIG. 30, FIG. 3E, FIG. 4A, FIG. 4C, and FIG. 4E show sectional views of the processes of manufacturing a memory cell MC and a select gate transistor SG. Here, there are shown four memory cells, a select gate transistor SG connected to the memory cells on one end, and a select gate transistor SG connected to other adjacently arranged memory cells on one end. FIG. 2B, FIG. 2D, FIG. 2F, FIG. 3B, FIG. 3D, FIG. 3F, FIG. 4B, FIG. 4D, and FIG. 4F show sectional views of the process of manufacturing a peripheral transistor PT.

Figure 2A:
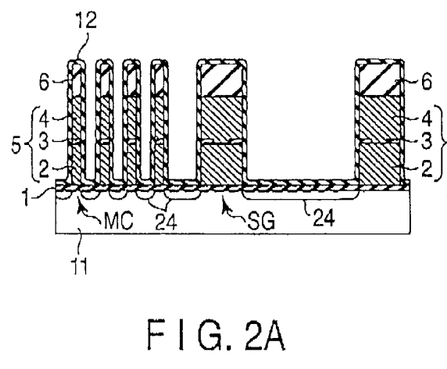
FIGS. 2A, 2B, 2C, 2D, 2E, 2F, 3A, 3B, 3C, 3D, 3E, 3F, 4A, 4B, 4C, 4D, 4E, and 4F are sectional views showing a method of manufacturing the NAND-type flash memory according to the first embodiment.
Figure 2B:
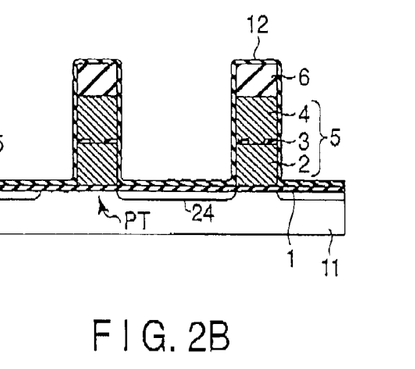

First, as in a conventional NAND-type flash memory, a gate insulating film 1 is formed on a semiconductor substrate 11, and stack gates 5 of the memory cell MC, the select gate transistor SG, and the peripheral transistor PT are formed on the gate insulating film 1, in accordance with a general process, as shown in FIG. 2A and FIG. 2B. Further, cap films 6 are formed on the stack gates 5.

The stack gate 5 of the memory cell MC has a floating gate electrode 2, an inter-gate insulating film 3, and a control gate electrode 4 that are formed on the gate insulating film 1 in order. Each of the stack gates 5 of the select gate transistor SG and the peripheral transistor PT has a first gate electrode 2, an inter-gate insulating film 3, and a control gate electrode 4 that are formed on the gate insulating film 1 in order. In each of the stack gates 5 of the select gate transistor SG and the peripheral transistor PT, the inter-gate insulating film 3 has an opening through which the first gate electrode 2 and the control gate electrode 4 are electrically connected to each other.

Silicon oxide films 12 are then formed by, for example, thermal oxidation on the stack gates 5 of the memory cell MC, the select gate transistor SG, and the peripheral transistor PT, and on the gate insulating film 1.

Furthermore, ion implantation of an impurity is carried out so that low-concentration diffusion layers 24 are formed on the semiconductor substrate 11 on both sides of the stack gate 5. That is, the low-concentration diffusion layers 24 are formed on the semiconductor substrate 11 between the memory cells MC, between the memory cell MC and the select gate transistor SG, and between the select gate transistors. At the same time, low-concentration diffusion layers 24 are formed on the semiconductor substrate 11 on both sides of the peripheral transistor PT.

Figure 2C:
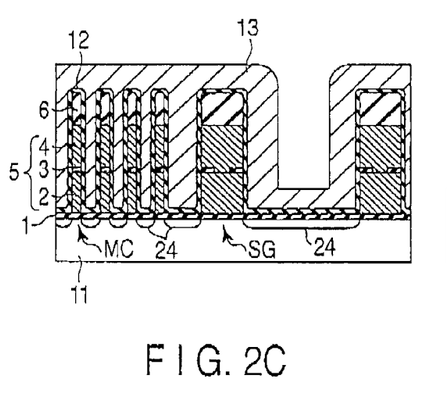
Figure 2D:
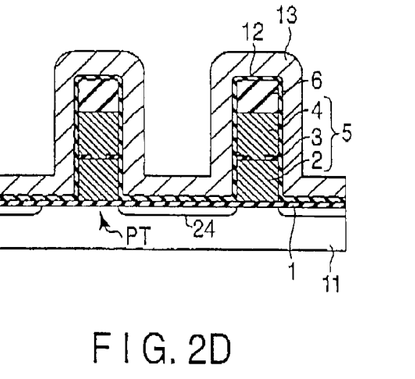

As shown in FIG. 2C and FIG. 2D, a sacrificial nitride film (e.g., silicon nitride film) 13 is then formed on the silicon oxide film 12 by chemical vapor deposition (CVD). Thus, the space between the memory cells MC and the space between the memory cell MC and the select gate transistor SG are filled with the sacrificial nitride film 13. At the same time, a sacrificial nitride film 13 is formed on the side surface of the stack gate 5 between the select gate transistors SG. Moreover, a sacrificial nitride film 13 is formed on the stack gate 5 of the peripheral transistor PT at the same time.

Figure 2E:
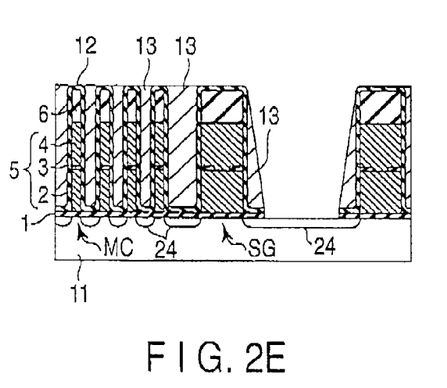
Figure 2F:
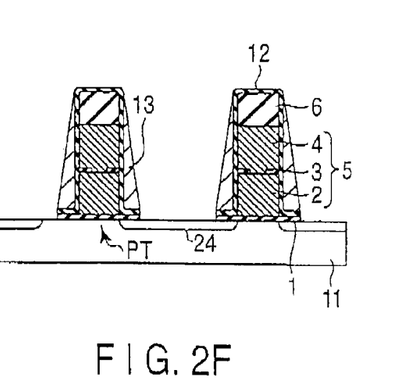

As shown in FIG. 2E and FIG. 2F, the sacrificial nitride films 13 are then etched back by anisotropic reactive ion etching (RIE). Thus, a sidewall insulating film 13 is formed on the side surface of the stack gate 5 between the select gate transistors SG while the space between the memory cells MC and the space between the memory cell MC and the select gate transistor SG are filled with the sacrificial nitride film 13. At the same time, a sidewall insulating film 13 is formed on the side surface of the stack gate 5 of the peripheral transistor PT. As a result of this etch back, the silicon oxide film 12 and the gate insulating film 1 between the select gate transistors SG are etched, and the semiconductor substrate 11 is exposed. In the peripheral transistor PT, the silicon oxide film 12 and the gate insulating film 1 located in the region where the sidewall insulating film 13 is not formed are etched, and the semiconductor substrate 11 is exposed. In addition, in the peripheral transistor PT, the silicon oxide film 12 located in the region where the sidewall insulating film 13 is not formed may be damaged.

Figure 3A:
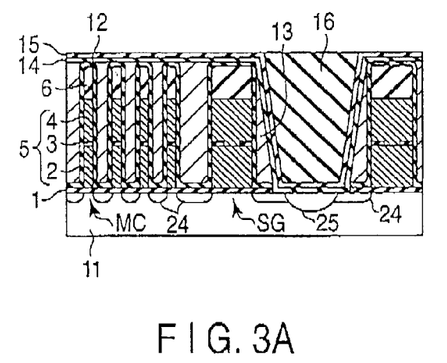
Figure 3B:
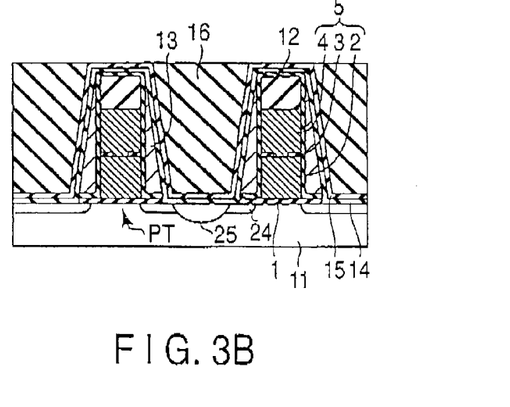

As shown in FIG. 3A and FIG. 3B, for example, TEOS is then deposited on the sacrificial nitride film 13, on the silicon oxide film 12, and on the semiconductor substrate 11 by the CVD to form a first liner film 14.

After the first liner film 14 is formed, ion implantation of an impurity is carried out so that a high-concentration diffusion layer 25 is formed on the semiconductor substrate 11 between the select gate transistors SG. At the same time, a high-concentration diffusion layer 25 is formed on the semiconductor substrate 11 on both sides of the peripheral transistor PT.

Furthermore, for example, a silicon nitride film is deposited on the first liner film 14 by the CVD to form a second liner film 15. After the second liner film 15 is formed, an interlayer insulating film 16 such as a silicon oxide film is formed by the CVD. Further, the interlayer insulating film 16 on the second liner film 15 is polished by chemical mechanical polish (CMP) so that the interlayer insulating film 16 only remains between the select gate transistors SG and between the peripheral transistors PT. After the high-concentration diffusion layer 25 is formed, a liner oxide film may be formed before the second liner film 15 is formed.

Figure 3C:
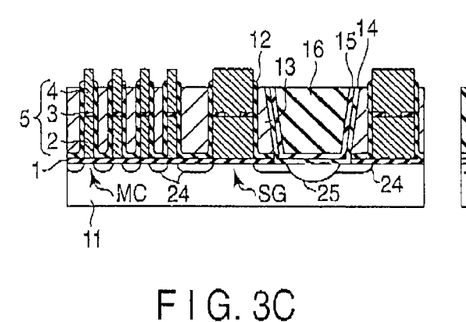
Figure 3D:
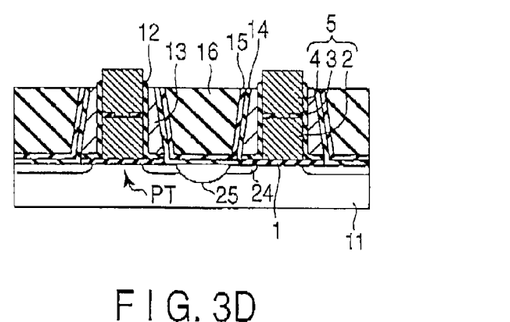

As shown in FIG. 3C and FIG. 3D, the interlayer insulating film 16, the second liner film 15, the first liner film 14, the sacrificial nitride film 13, the silicon oxide film 12, and the cap film 6 are removed by the RIE to expose the upper surface of the control gate electrode 4. In this RIE, the interlayer insulating film 16, the second liner film 15, the first liner film 14, the sacrificial nitride film 13, and the silicon oxide film 12 are etched to a level between the upper surface and lower surface of the control gate electrode 4.

Figure 3E:
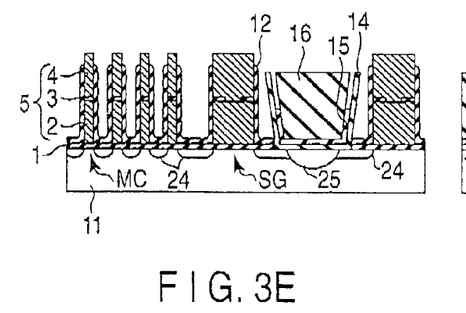
Figure 3F:
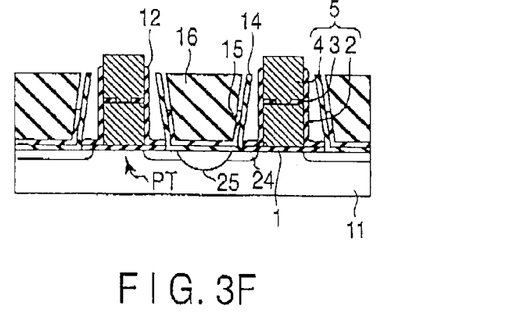

As shown in FIG. 3E and FIG. 3F, the sacrificial nitride film 13 is etched by, for example, wet etching. In this case, the second liner film 15 intervening between the first liner film 14 and the interlayer insulating film 16 is not entirely etched, and remains at a position lower than the inter-gate insulating film 3. That is, the second liner film 15 is etched so that the tip of the second liner film 15 remains between the upper surface and lower surface of the first gate electrode 2. The second liner film 15 intervening between the first liner film 14 and the interlayer insulating film 16 is thinner than the sacrificial nitride film 13 intervening between the silicon oxide film 12 and the first liner film 14. As a result, an etching solution does not easily come into the second liner film 15 intervening between the first liner film 14 and the interlayer insulating film 16, and the lower part of the second liner film 15 remains at the position lower than the inter-gate insulating film 3. Depending on an etching condition, the second liner film 15 may be totally removed.

Figure 4A:
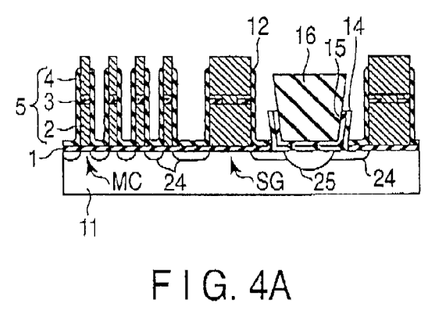
Figure 4B:
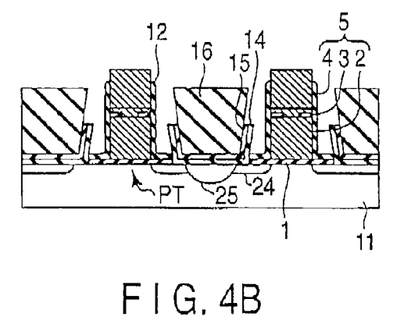

As shown in FIG. 4A and FIG. 4B, the upper surface of the first liner film 14 is then made lower than the inter-gate insulating film 3 by, for example, dry etching or wet etching. Further, the upper parts of the control gate electrodes 4 of the memory cell IC, the select gate transistor SG, and the peripheral transistor PT are silicided. That is, a metal film of, for example, Ni is deposited on the control gate electrode 4, and thermally treated. Unreacted Ni is then removed. Thus, the control gate electrode 4 is partly or totally changed into a nickel silicide film. Instead of Ni, Ti, Co, Pt, Pd, Ta, or Mo is used for the metal film. Before the metal film is deposited on the exposed surface of the control gate electrode 4, a pre-treatment may be performed by, for example, dry etching or wet etching. The upper surface of the first liner film 14 can be made lower than the inter-gate insulating film 3 simultaneously with this pre-treatment to simplify the process.

Although the upper surface of the first liner film 14 and the upper surface of the second liner film 15 are in alignment with each other in FIG. 4A and FIG. 4B, these upper surfaces may be differently located. In order to form an air gap 19A, the upper surfaces of the first liner film 14 and the second liner film 15 are preferably made lower than the inter-gate insulating film 3. However, the air gap 19A may be able to be formed if the upper surface of the first liner film 14 is lower than the inter-gate insulating film 3.

Figure 4C:
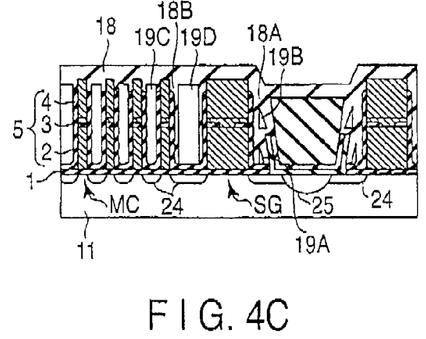
Figure 4D:
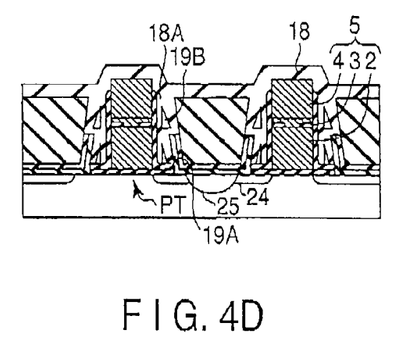

TEOS is then deposited on the structure shown in FIG. 4A and FIG. 4B by, for example, plasma CVD to form an interlayer insulating film 18. The plasma CVD is a deposition method which permits faster lateral growth and which provides a lower filling quality (lower coverage). Therefore, as shown in FIG. 4C and FIG. 4D, sidewall insulating films 18A having air gaps 19A and 19B are formed on the side surface of the stack gate between the select gate transistors SG and on the side surface of the stack gate of the peripheral transistor PT. The sidewall insulating film 18A has the two air gaps 19A and 19B. The air gap 19A is formed in the sidewall insulating film 18A between the gate insulating film 1 and the inter-gate insulating film 3. The air gap 19B is formed in the sidewall insulating film 18A above the air gap 19A (or above the second liner film 15). At the same time, the sidewall insulating film 18B having air gaps 19C and 19D is formed between the memory cells MC and between the memory cell MC and the select gate transistor SG.

Figure 4E:
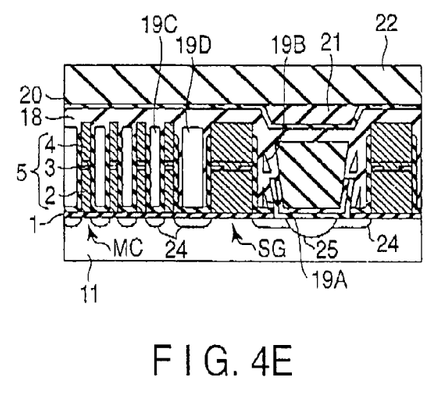
Figure 4F:
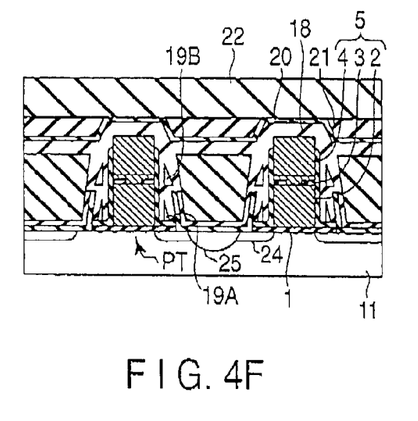

As shown in FIG. 4E and FIG. 4F, a silicon nitride film 20 is then formed on the interlayer insulating film 18. This silicon nitride film 20 serves as a stopper film during the fabrication of a contact hole. Further, an interlayer insulating film 21 is formed on the silicon nitride film 20. The interlayer insulating film 21 is then polished by the CMP to planarize the upper part of the memory cell MC, the upper part of the select gate transistor SG, and the upper part of the peripheral transistor PT. Further, an interlayer insulating film 22 is formed on the silicon nitride film 20 and on the interlayer insulating film 21.

Furthermore, a contact hole is made between the select gate transistors SG by the RIE, and as shown in FIG. 1A, the contact hole is filled with a metal to form a contact plug 23A connected to the diffusion layer 25. A contact hole is also made on the control gate electrode 4 of the peripheral transistor PT by the RIE, and as shown in FIG. 1B, the contact hole is filled with a metal to form a contact plug 23B connected to the control gate electrode 4.

In the manufacturing method according to the first embodiment described above, a great margin for the displacement of the contact hole can be allowed during the fabrication of the contact plug 23B connected to the control gate electrode 4. For example, when an air gap formed in the sidewall insulating film reaches a position close to the upper surface of the silicided control gate electrode, there is fear that the contact hole may penetrate to reach the air gap if the contact hole is displaced during the fabrication of the contact hole. When the contact hole penetrates to reach the air gap, a metal material for forming the contact plug also comes into the air gap, and the contact plug 23B and the semiconductor substrate 11 may cause a short circuit.

In contrast, according to the present embodiment, the upper part of the air gap 19B is formed in the vicinity of the upper surface of the control gate electrode, but the interlayer insulating film 18 is formed between the air gap 19B and the air gap 19A. Thus, even if the contact hole and the air gap 19B penetrate due to the misalignment of the contact hole, the interlayer insulating film 18 between the air gap 19B and the air gap 19A can prevent the contact hole from reaching the semiconductor substrate. Thus, it is possible to prevent a short circuit between the contact plug 23B and the semiconductor substrate 11.

In a direction in which the select gate transistors SG adjoin, the centers of the air gaps 19A and 19B can be displaced to increase the distance between the air gap 19A and the air gap 19B. As a result, it is possible to effectively prevent a short circuit between the contact plug 23B and the semiconductor substrate 11.

Moreover, a great margin for the displacement of the contact hole can be allowed during the fabrication of the contact plug 23A connected to the diffusion layer 25 because the second liner film 15 is present between the contact plug 23A and the air gap 19A. If a contact hole for forming the contact plug 23A is fabricated under the condition that etching selectivity is allowed between the interlayer insulating film 16 and the second liner film 15, it is possible to effectively prevent the air gap 19A and the contact hole from penetrating.

[2] Second Embodiment

A NAND-type flash memory according to a second embodiment is described. According to the first embodiment, the second liner films 15 and the interlayer insulating films 16 are formed between the select gate transistors SG and on both sides of the peripheral transistor PT. In a structure according to the second embodiment, first liner films 15 and interlayer insulating films 16 do not remain between select gate transistors SG and on both sides of a peripheral transistor PT.

Figure 5A:
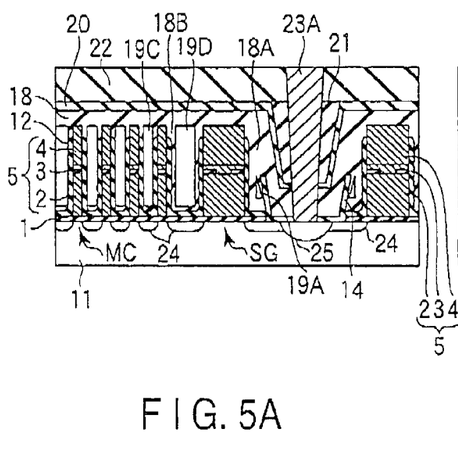
FIGS. 5A and 5B are sectional views showing the structure of a NAND-type flash memory according to a second embodiment.

(1) Structure According to the Second Embodiment (1-1) Memory Cell Transistor and Select Gate Transistor FIG. 5A is a sectional view showing the structures of a memory cell transistor MC and a select gate transistor SG in the NAND-type flash memory according to the second embodiment.

As shown in FIG. 5A, a gate insulating film (tunnel oxide film) 1 is formed on a semiconductor substrate 11. Stack gates 5 of the memory cells MC and a stack gate 5 of the select gate transistor SG that constitute a first NAND cell unit are formed on the gate insulating film 1. The stack gates 5 of the memory cell transistors MC are arranged at predetermined intervals. The stack gate 5 of the select gate transistor SG is disposed adjacent to the end stack gate among the stack gates 5 of the memory cells MC.

Furthermore, on the semiconductor substrate 11, a second NAND cell unit is disposed adjacent to the first NAND cell unit. The stack gate of the select gate transistor SG that constitutes the second NAND cell unit is disposed adjacent to the stack gate of the select gate transistor SG of the first NAND cell unit.

The stack gate 5 of the memory cell MC has a floating gate electrode 2, an inter-gate insulating film 3, and a control gate electrode 4 that are formed on the gate insulating film 1 in order. The control gate electrode 4 has a silicide layer on its top.

The stack gate 5 of the select gate transistor SG has a first gate electrode 2, an inter-gate insulating film 3, and a control gate electrode 4 that are formed on the gate insulating film 1 in order. The control gate electrode 4 has a silicide layer on its top. In the stack gate 5 of the select gate transistor SG, the inter-gate insulating film 3 has an opening through which the first gate electrode 2 and the control gate electrode 4 are electrically connected to each other.

Low-concentration diffusion layers 24 are formed on the semiconductor substrate 11 between the memory cells MC and on the semiconductor substrate 11 between the memory cell MC and the select gate transistor SG. Moreover, a low-concentration diffusion layer 24 and a high-concentration diffusion layer 25 are formed in the semiconductor substrate 11 between the select gate transistors SG.

A first liner film 14 made of, for example, TEOS is formed on the semiconductor substrate 11 between the select gate transistors SG.

A silicon oxide film 12 is formed on the side surfaces of the stack gates of the memory cell and the select gate transistor SG. An interlayer insulating film 18 having air gaps 19A, 19C, and 19D is formed on the silicon oxide film 12, on the control gate electrode 4, and on the first liner film 14. The air gap 19C is formed between the memory cells MC, and the air gap 19D is formed between the memory cell MC and the select gate transistor SG. Further, the air gap 19A is formed between the stack gate of the select gate transistor SG and the first liner film 14. That is, a sidewall insulating film 18A having the air gap 19A is formed on the side surface of the stack gate between the select gate transistors SG. The air gap 19A is formed in the sidewall insulating film 18A between the gate insulating film 1 and the inter-gate insulating film 3.

The air gaps may not be completely surrounded by the interlayer insulating film 18. For example, when the air gap is formed by the interlayer insulating film 18 and some other insulating film, for example, the first liner film 14, the interlayer insulating film 18 is also defined as having the air gap. Moreover, the silicon oxide film 12, the first liner film 14, and the interlayer insulating film 18 may not be distinguished in, for example, SEM observation or TEM observation. That is, the two air gaps 19A and 19B surrounded by an insulating film including the interlayer insulating film 18 have only to be located on the side surface of the stack gate of the select gate transistor SG. Moreover, a sidewall insulating film 18B having the air gaps 19C and 19D is formed between the memory cells MC and between the memory cell MC and the select gate transistor SG.

The upper end of the air gap 19A is located lower than the inter-gate insulating film 3. Between the air gap 19A and the semiconductor substrate 11, the interlayer insulating film 18, the first liner film 14, and the gate insulating film 1 are disposed, and there is no second liner film 15. That is, there is no film having a large amount of trapped charges, for example, silicon nitride film between the air gap 19A and the semiconductor substrate 11. As a result, a parasitic capacitance between the select gate transistor SG and the semiconductor substrate 11 can be further reduced.

The air gap 19C is located between the control gate electrodes 4 and between the first gate electrodes 2 in the memory cells MC. That is, the height (a direction in which the floating gate electrode 2 and the control gate electrode 4 are stacked) of the air gap 19C is greater than the height of the air gap 19A. As a result, a parasitic capacitance between the memory cells MC can be effectively reduced.

The air gap 19D is located between the control gate electrodes 4 and between the floating gate electrodes 2 in the memory cell MC and the select gate transistor SG. That is, the height (a direction in which the floating gate electrode 2 and the control gate electrode 4 are stacked) of the air gap 19D is greater than the height of the air gap 19A. As a result, an electric field directed from the select gate transistor SG to the memory cell MC can be effectively weakened.

A silicon nitride film 20 is formed on the interlayer insulating film 18. An interlayer insulating film 21 is formed on the silicon nitride film 20 between the select gate transistors SG. Further, an interlayer insulating film 22 is formed on the silicon nitride film 20 and on the interlayer insulating film 21.

Moreover, the contact plug 23A connected to the diffusion layer 25 is formed on the diffusion layer 25 between the select gate transistors SG.

(1-2) Peripheral Transistor

Figure 5B:
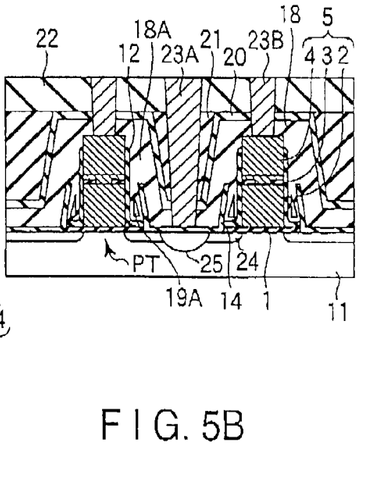
Figure 6A:
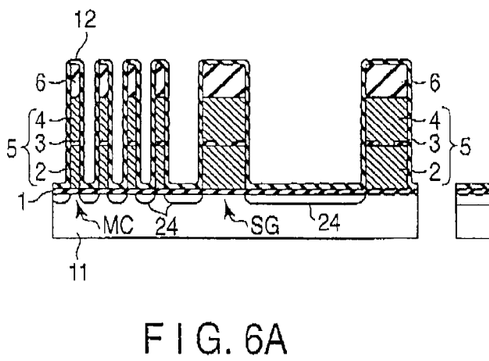
FIGS. 6A, 6B, 6C, 6D, 6E, 6F, 7A, 7B, 7C, 7D, 7E, 7F, 8A, 8B, 8C, 8D, 8E, 8F, 9A, 9B, 9C, and 9D are sectional views showing a method of manufacturing the NAND-type flash memory according to the second embodiment.
Figure 6B:
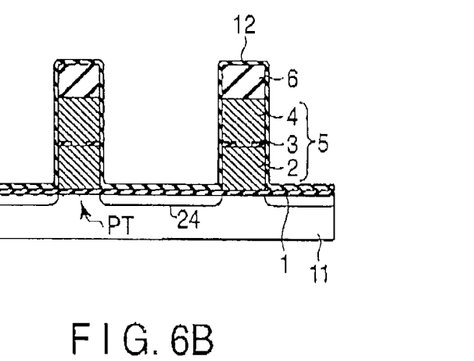
Figure 6C:
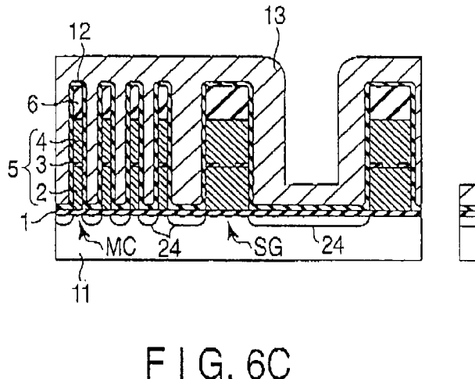
Figure 6D:
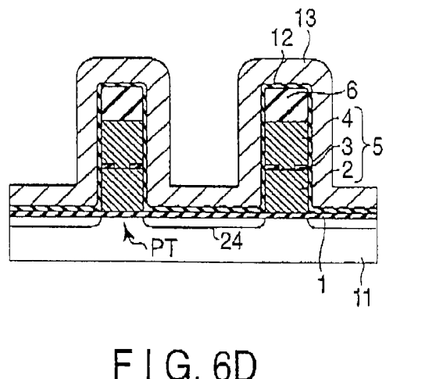
Figure 6E:
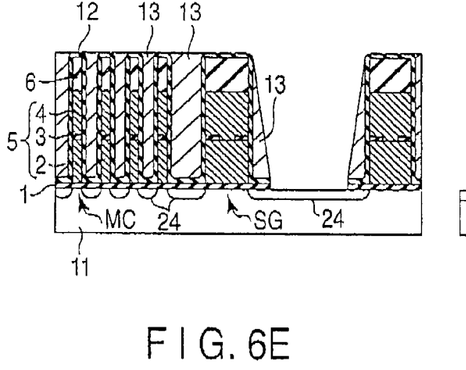
Figure 6F:
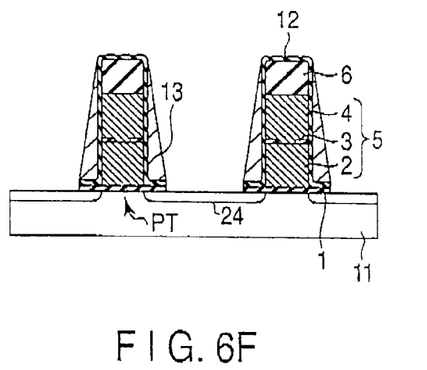

FIG. 5B is a sectional view showing the structure of the peripheral transistor in the NAND-type flash memory according to the first embodiment.

As shown in FIG. 5B, a gate insulating film 1 is formed on a semiconductor substrate 11. Stack gates 5 of peripheral transistors PT that constitute the peripheral circuit are formed on the gate insulating film 1.

The stack gate 5 of the peripheral transistor PT has a first gate electrode 2, an inter-gate insulating film 3, and a control gate electrode 4 that are formed on the gate insulating film 1 in order. The control gate electrode 4 has a silicide layer on its top. In the stack gate 5 of the peripheral transistor PT, the inter-gate insulating film 3 has an opening through which the first gate electrode 2 and the control gate electrode 4 are electrically connected to each other.

A low-concentration diffusion layer 24 and a high-concentration diffusion layer 25 are formed in the semiconductor substrate 11 on both sides of the peripheral transistor PT. A first liner film 14 is formed on the semiconductor substrate 11 between the peripheral transistors.

A silicon oxide film 12 is formed on the side surface of the stack gate of the peripheral transistor PT. An interlayer insulating film 18 having an air gap 19A is formed on the silicon oxide film 12, on the control gate electrode 4, and on the first liner film 14. That is, the air gap 19A is formed between the stack gate of the peripheral transistor PT and the first liner film 14. The air gap 19A formed in the side surface of the stack gate of the select gate transistor SG and the air gap 19A formed in the side surface of the stack gate between the peripheral transistors PT have similar structures.

In other words, the sidewall insulating film 18A having the air gap 19A is formed on the side surface of the stack gate between the peripheral transistors PT. The air gap 19A is formed in the sidewall insulating film 18A between the gate insulating film 1 and the inter-gate insulating film 3. A silicon nitride film 20 is formed on the interlayer insulating film 18. An interlayer insulating film 21 is formed on the silicon nitride film 20 between the select gate transistors SG. Further, an interlayer insulating film 22 is formed on the silicon nitride film 20 and on the interlayer insulating film 21.

A contact plug 23B connected to the control gate electrode 4 is formed on the control gate electrode 4 of the peripheral transistor PT.

In the second embodiment, the sidewall insulating film 18A having the air gap 19A is formed on the side surface of the stack gate of the peripheral transistor PT. That is, as the air gap is formed in the gate sidewall insulating film of the peripheral transistor PT, a parasitic capacitance between the stack gate 5 and the diffusion layers 24 and 25 can be reduced. Consequently, the operation in the peripheral circuit, the operation of writing, reading, and erasing data in the memory cell transistor MC can be increased in speed.

Furthermore, the sidewall insulating film 18A having the air gap 19A is formed on the side surface of the stack gate 5 of the select gate transistors SG. That is, as the air gap is formed in the gate sidewall insulating film of the select gate transistors SG, a parasitic capacitance between the stack gate 5 and the diffusion layers 24 and 25 and a parasitic capacitance between the stack gate 5 and the contact plug 23A can be reduced. Consequently, the operation of writing, reading, and erasing data in the memory cell transistor MC can be increased in speed.

Still further, as the sidewall insulating film 18B having the air gaps 19C and 19D is formed on the side surface of the stack gate 5 of the memory cell transistor MC, that is, as the air gaps are formed between the stack gates of the memory cell transistor MC, a parasitic capacitance between the stack gates 5 and a parasitic capacitance between the stack gate 5 and the diffusion layer 24 can be reduced. Consequently, the operation of writing, reading, and erasing data in the memory cell transistor MC can be increased in speed.

Moreover, the silicon nitride film 20 is formed on the semiconductor substrate on both sides of the peripheral transistor PT via the first liner film 14 and the interlayer insulating film 18. That is, as the distance between the diffusion layers 24 and 25 and the silicon nitride film 20 is great, electrons trapped by the silicon nitride film 20 can be reduced. For example, if the silicon nitride film is formed at a position close to the end of a gate electrode, there is fear that electrons may be trapped by the silicon nitride film due to a high electric field applied to the diffusion layer and transistor characteristics such as a threshold voltage may change. According to the present embodiment, the diffusion layers and the silicon nitride film are apart from each other at distance corresponding to the first liner film 14 and the interlayer insulating film 18, so that electrons trapped by the silicon nitride film can be reduced. Thus, the peripheral transistor can be improved in reliability.

The silicon nitride film 20 is formed on the semiconductor substrate between the select gate transistors via the first liner film 14 and the interlayer insulating film 18, that is, the distance between the diffusion layers 24 and 25 and the silicon nitride film 20 is great, so that electrons trapped by the silicon nitride film 20 can be reduced. Thus, the select gate transistor can be improved in reliability as in the case described above.

(2) Manufacturing Method According to the Second Embodiment

FIGS. 6A to 6F, FIGS. 7A to 7F, FIGS. 8A to 8F, and FIGS. 9A to 9D are sectional views showing a method of manufacturing the NAND-type flash memory according to the second embodiment. FIG. 6A, FIG. 6C, FIG. 6E, FIG. 7A, FIG. 7C, FIG. 7E, FIG. 8A, FIG. 8C, FIG. 8E, FIG. 9A and FIG. 9C show sectional views of the processes of manufacturing a memory cell MC and a select gate transistor SG. FIG. 6B, FIG. 6D, FIG. 6F, FIG. 7B, FIG. 7D, FIG. 7F, FIG. 8B, FIG. 8D, FIG. 8F, FIG. 9B and FIG. 9D show sectional views of the process of manufacturing a peripheral transistor PT.

The processes in FIGS. 6A to 6F and FIGS. 7A to 7D are similar to the above-described processes in FIGS. 2A to 2F and FIGS. 3A to 3D and are therefore not described.

Figure 7A:
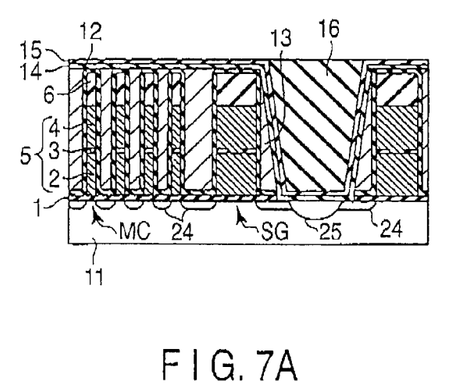
Figure 7B:
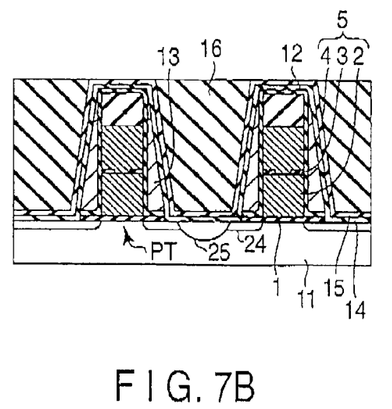
Figure 7C:
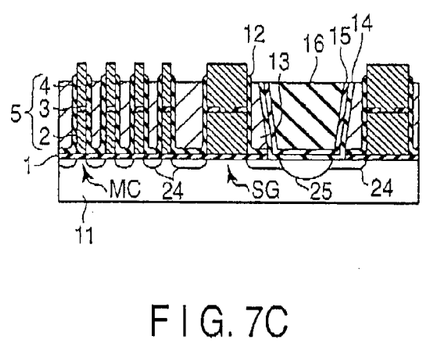
Figure 7D:
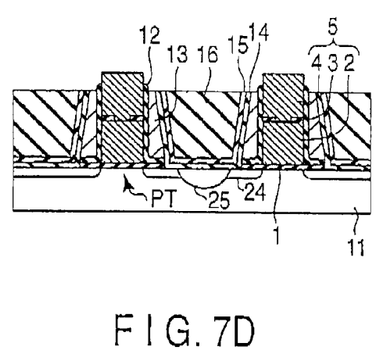
Figure 7E:
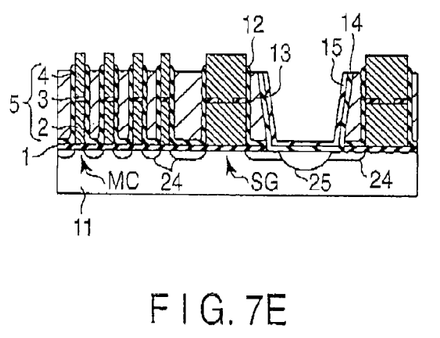
Figure 7F:
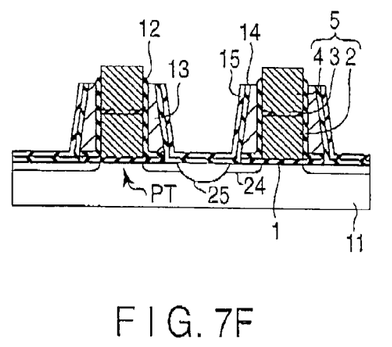

After the upper surface of the control gate electrode 4 is exposed by the RIE as shown in FIG. 7C and FIG. 7D, the interlayer insulating film 16 is removed by wet etching as shown in FIG. 7E and FIG. 7F.

Figure 8A:
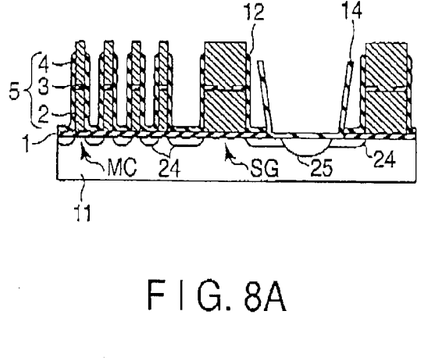
Figure 8B:
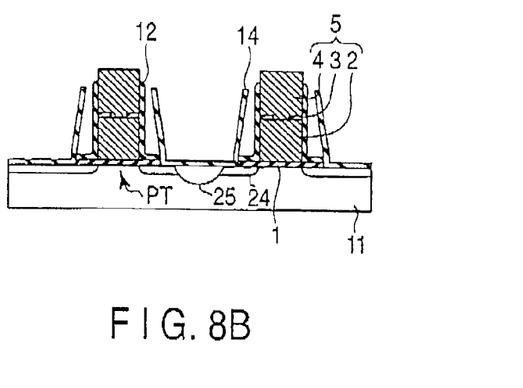

As shown in FIG. 8A and FIG. 8B, the sacrificial nitride film 13 and the second liner film 15 are then removed by wet etching. Here, in contrast with the first embodiment, the second liner film 15 does not intervene between the first liner film 14 and the interlayer insulating film 16, and one surface of the second liner film 15 is exposed. As a result, the second liner film 15 is substantially totally removed in the process of removing the sacrificial nitride film 13.

Figure 8C:
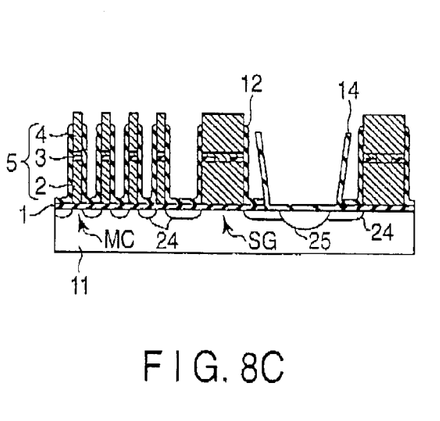
Figure 8D:
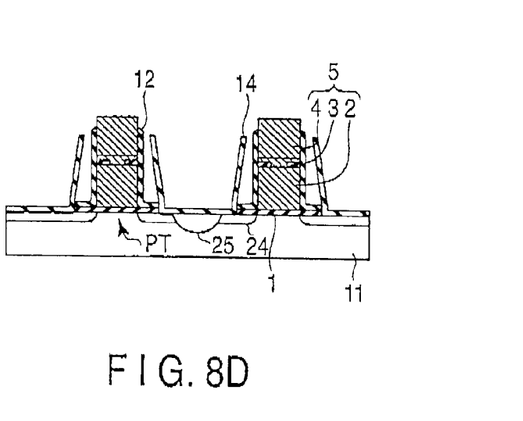

As shown in FIG. 8C and FIG. 8D, the upper surface of the first liner film 14 is then made lower than the inter-gate insulating film 3 by, for example, dry etching or wet etching. Further, the upper parts of the control gate electrode 4 of the memory cell MC, the select gate transistor SG, and the peripheral transistor PT are silicided. That is, a metal film of, for example, Ni is deposited on the control gate electrode 4, and thermally treated. Unreacted Ni is then removed. Thus, the control gate electrode 4 is partly or totally changed into a nickel silicide film. Instead of Ni, Ti, Co, Pt, Pd, Ta, or Mo is used for the metal film. Before the metal film is deposited on the exposed surface of the control gate electrode 4, a pretreatment may be performed by, for example, dry etching or wet etching. The upper surface of the first liner film 14 can be made lower than the inter-gate insulating film 3 simultaneously with this pre-treatment to simplify the process.

Figure 8E:
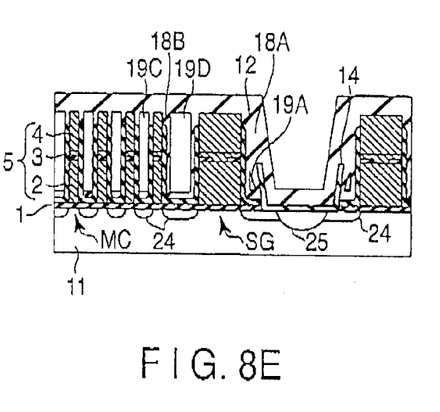
Figure 8F:
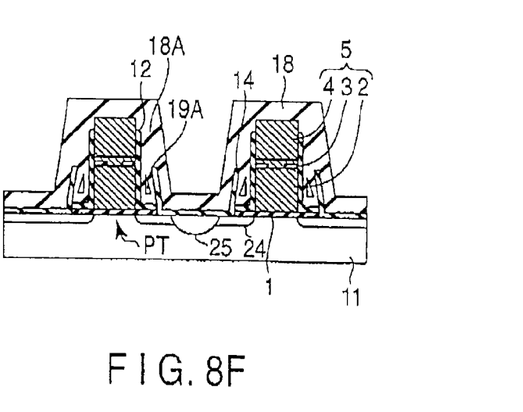

TEOS is then deposited on the structure shown in FIG. 8C and FIG. 8D by, for example, plasma CVD to form an interlayer insulating film 18. The plasma CVD is a deposition method which permits faster lateral growth and which provides a lower filling quality (lower coverage). Therefore, as shown in FIG. 8E and FIG. 8F, sidewall insulating films 18A having air gaps 19A are formed on the side surface of the stack gate between the select gate transistors SG and on the side surface of the stack gate of the peripheral transistor PT. The air gap 19A is formed in the sidewall insulating film 18A between the gate insulating film 1 and the inter-gate insulating film 3. At the same time, the sidewall insulating film 18B having air gaps 19C and 19D is formed between the memory cells MC and between the memory cell MC and the select gate transistor SG.

Here, in contrast with the first embodiment, the interlayer insulating film 16 is removed during the formation of the interlayer insulating film 18. That is, the part corresponding to the air gap 19B in the first embodiment can be filled with the interlayer insulating film 18, and the air gap 19A is only formed on the side surface of the stack gate between the select gate transistors SG and on the side surface of the stack gate of the peripheral transistor PT.

Figure 9A:
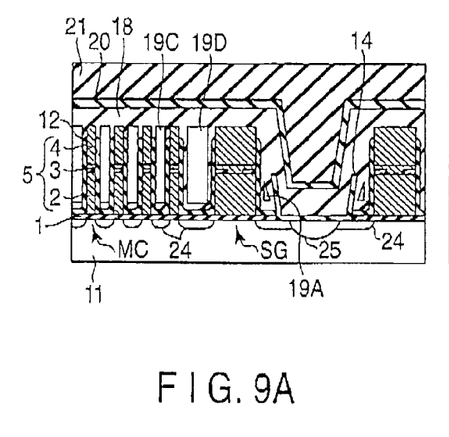
Figure 9B:
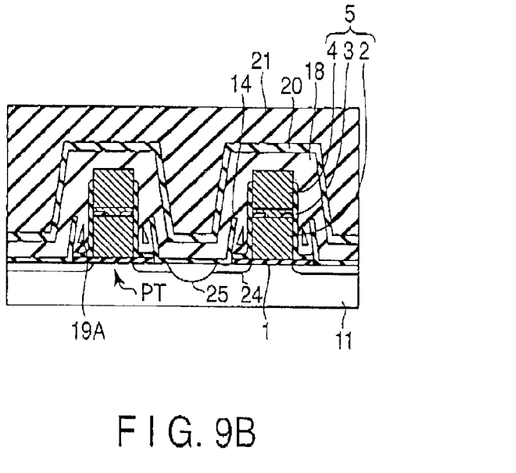
Figure 9C:
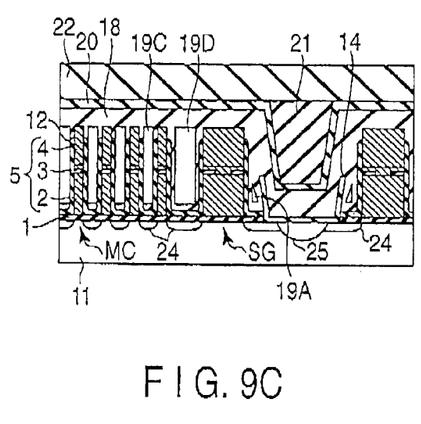
Figure 9D:
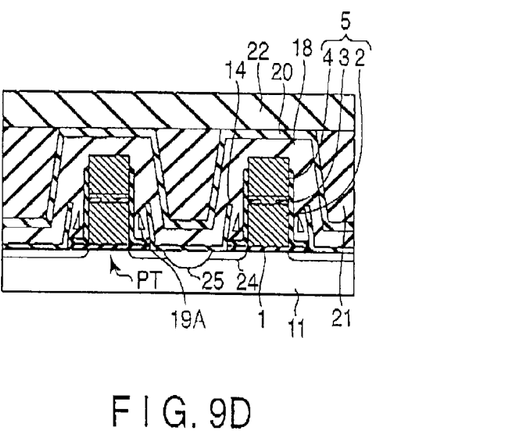

As shown in FIG. 9A and FIG. 9B, a silicon nitride film 20 is then formed on the interlayer insulating film 18. Further, an interlayer insulating film 21 is formed on the silicon nitride film 20. The interlayer insulating film 21 is then polished by the CMP to planarize the upper part of the memory cell MC, the upper part of the select gate transistor SG, and the upper part of the peripheral transistor PT. Further, as shown in FIG. 9C and FIG. 9D, an interlayer insulating film 22 is formed on the silicon nitride film 20 and on the interlayer insulating film 21.

Furthermore, a contact hole is made between the select gate transistors SG by the RIE, and as shown in FIG. 5A, the contact hole is filled with a metal to form a contact plug 23A connected to the diffusion layer 25. A contact hole is also made on the control gate electrode 4 of the peripheral transistor PT by the RIE, and as shown in FIG. 5B, the contact hole is filled with a metal to form a contact plug 23B connected to the control gate electrode 4.

In the manufacturing method according to the second embodiment, a great margin for the displacement of the contact hole can be allowed during the fabrication of the contact plug 23B connected to the control gate electrode 4. For example, when an air gap formed in the sidewall insulating film reaches the height of the silicided control gate electrode, there is fear that the contact hole may penetrate to reach the air gap if the contact hole is displaced during the fabrication of the contact hole. When the contact hole penetrates to reach the air gap, a metal material for forming the contact plug also comes into the air gap, and the contact plug 23B and the semiconductor substrate 11 may cause a short circuit.

In contrast, according to the present embodiment, no air gap is formed in the vicinity of the upper surface of the control gate electrode. Moreover, the upper part of the air gap 19A is formed at a position lower than the inter-gate insulating film 3. Therefore, the contact hole is unlikely to reach the air gap 19A due to the misalignment of the contact hole, and the contact hole can be prevented from reaching the semiconductor substrate. As a result, it is possible to prevent a short circuit between the contact plug 23B and the semiconductor substrate 11.

The present embodiment focuses on a capacitance between a gate and a diffusion layer and a capacitance between a gate and a diffusion layer electrode which are parasitic capacitances of transistors.

A silicon oxide film or a silicon nitride film has heretofore been used for the gate sidewall insulating film. The relative dielectric constant of the silicon oxide film is about 3.9, and the relative dielectric constant of the silicon nitride film is about 7.0. In this case, there are a capacitance C1 between a gate and a diffusion layer, and a capacitance C2 between a gate and a diffusion layer electrode.

In the present embodiment, air (having a relative dielectric constant of about 1.0) which is lower in relative dielectric constant than the silicon oxide film and the silicon nitride film is formed in a gate sidewall insulating film. Thus, the present embodiment provides a capacitance C1' (C1>C1') between the gate and the diffusion layer, and a capacitance C2' (C2>C2') between the gate and the diffusion layer electrode, and permits the reduction of the parasitic capacitance as compared with the examples of the conventional arts.

As described above, according to the embodiments, it is possible to provide a nonvolatile semiconductor memory device capable of reducing a delay in the operation of a peripheral circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   first memory cell transistors formed on a semiconductor substrate at predetermined intervals, each of the first memory cell transistors comprising a first stack gate which includes a first floating gate electrode, a second gate insulating film, and a first control gate electrode that are stacked in order on a first gate insulating film disposed on the semiconductor substrate;
   an interlayer insulating film formed between the first stack gates, the interlayer insulating film comprising a first air gap;
   a first peripheral transistor formed on the semiconductor substrate, the first peripheral transistor comprising a second stack gate which includes a first gate electrode, a fourth gate insulating film, and a second gate electrode that are stacked in order on a third gate insulating film disposed on the semiconductor substrate; and
   a first sidewall insulating film formed on a side surface of the second stack gate of the first peripheral transistor, the first sidewall insulating film comprising a second air gap,
   wherein an upper end of the second air gap of the first sidewall insulating film is located at a position lower than the fourth gate insulating film.

2. The nonvolatile semiconductor memory device according to claim 1, wherein
   the first sidewall insulating film further comprises a third air gap formed above the second air gap.

3. The nonvolatile semiconductor memory device according to claim 1, wherein
   a silicon oxide film occupies a region between the semiconductor substrate and the lower end of the second air gap of the first sidewall insulating film.

4. The nonvolatile semiconductor memory device according to claim 1, further comprising:
   a first select gate transistor formed adjacent to the first memory cell transistor on the semiconductor substrate, the first select gate transistor comprising a third stack gate which includes a third gate electrode, a sixth gate insulating film, and a fourth gate electrode that are stacked in order on the fifth gate insulating film formed on the semiconductor substrate; and
   a second sidewall insulating film formed on a side surface of the third stack gate of the first select gate transistor, the second sidewall insulating film comprising a fourth air gap,
   wherein an upper end of the fourth air gap of the second sidewall insulating film is located at a position on the semiconductor substrate lower than the sixth gate insulating film.

5. The nonvolatile semiconductor memory device according to claim 4, wherein
   the second sidewall insulating film further comprises a fifth air gap formed above the fourth air gap.

6. The nonvolatile semiconductor memory device according to claim 1, wherein
   an upper end of the first air gap is located at a position higher than the second air gap.

7. The nonvolatile semiconductor memory device according to claim 1, further comprising:
   a first diffusion layer formed on the semiconductor substrate adjacent to the second stack gate of the first peripheral transistor; and
   a first contact plug formed on the first diffusion layer.

8. The nonvolatile semiconductor memory device according to claim 7, wherein
   the second air gap is located between the second stack gate of the first peripheral transistor and the first contact plug.

9. The nonvolatile semiconductor memory device according to claim 4, wherein
   a sixth air gap is formed between the first stack gate of the first memory cell transistor and the third stack gate of the first select gate transistor.

10. The nonvolatile semiconductor memory device according to claim 4, further comprising:
    a second diffusion layer formed on the semiconductor substrate adjacent to the third stack gate of the first select gate transistor; and
    a second contact plug formed on the second diffusion layer.

11. The nonvolatile semiconductor memory device according to claim 10, wherein
    the fourth air gap is located between the third stack gate of the first select gate transistor and the second contact plug.

12. The nonvolatile semiconductor memory device according to claim 7, further comprising:
    a first liner film formed on the first sidewall insulating film and the first diffusion layer,
    wherein an upper end of the second air gap is located at a position lower than an upper end of the first liner film.

13. The nonvolatile semiconductor memory device according to claim 7, further comprising:
    a first liner film formed on the first sidewall insulating film and the first diffusion layer,
    wherein an upper end of the third air gap is located at a position higher than an upper end of the first liner film.

14. A nonvolatile semiconductor memory device manufacturing method, the method comprising:
    forming first stack gates of memory cell transistors on a semiconductor substrate, each of the first stack gates comprising a first gate insulating film, a floating gate electrode, a second gate insulating film, and a control gate electrode that are stacked in order on the semiconductor substrate;
    forming second stack gates of select gate transistors on the semiconductor substrate, each of the second stack gates comprising the first gate insulating film, a first gate electrode, a third gate insulating film, and a second gate electrode that are stacked in order on the semiconductor substrate;
    forming a third stack gate of a peripheral transistor on the semiconductor substrate, the third stack gate comprising the first gate insulating film, a third gate electrode, a fourth gate insulating film, and a fourth gate electrode that are stacked in order on the semiconductor substrate;
    forming a sacrificial film on side surfaces of the first, second, and third stack gates and on the semiconductor substrate;
    etching back the sacrificial film to form a sidewall film on the side surface of the second stack gate between the second stack gates and the side surface of the third stack gate from the sacrificial film, while leaving the sacrificial film between the first stack gates and between the first stack gate and the second stack gate;

forming a first liner film and a second liner film in order, on the semiconductor substrate between the second stack gates and on the semiconductor substrate on both sides of the third stack gate;

forming an first interlayer insulating film on the second liner film between the second stack gates and on the second liner film on both sides of the third stack gate;

etching back the first interlayer insulating film, the first liner film, the second liner film, and the sacrificial film to expose upper surfaces of the first, second, and third stack gates;

removing the sacrificial film and the second liner film after the upper surfaces of the first, second, and third stack gates are exposed;

etching an upper part of the first liner film to be lower than the third and fourth gate insulating films; and forming a second interlayer insulating film to form a first air gap between the first stack gates, a sidewall insulating film comprising a second air gap on the side surface of the third stack gate, and a third air gap between the first stack gate and the second stack gate.

15. The nonvolatile semiconductor memory device manufacturing method according to claim 14, wherein
an upper end of the first air gap is located at a position on the semiconductor substrate lower than the fourth gate insulating film.

16. The nonvolatile semiconductor memory device manufacturing method according to claim 14, wherein
the first stack gate of the memory cell transistor, the second stack gate of the select gate transistor, and the third stack gate of the peripheral transistor are formed in the same process.

17. A nonvolatile semiconductor memory device manufacturing method, the method comprising:
forming first stack gates of memory cell transistors on a semiconductor substrate, each of the first stack gates comprising a first gate insulating film, a floating gate electrode, a second gate insulating film, and a control gate electrode that are stacked in order on the semiconductor substrate;

forming second stack gates of select gate transistors on the semiconductor substrate, each of the second stack gates comprising the first gate insulating film, a first gate electrode, a third gate insulating film, and a second gate electrode that are stacked in order on the semiconductor substrate;

forming a third stack gate of a peripheral transistor on the semiconductor substrate, the third stack gate comprising the first gate insulating film, a third gate electrode, a fourth gate insulating film, and a fourth gate electrode that are stacked in order on the semiconductor substrate;

forming a sacrificial film on side surfaces of the first, second, and third stack gates and on the semiconductor substrate;

etching back the sacrificial film to form a sidewall film on the side surface of the second stack gate between the second stack gates and the side surface of the third stack gate from the sacrificial film, while leaving the sacrificial film between the first stack gates and between the first stack gate and the second stack gate;

forming a first liner film and a second liner film in order, on the semiconductor substrate between the second stack gates and on the semiconductor substrate on both sides of the third stack gate;

forming an first interlayer insulating film on the second liner film between the second stack gates and on the second liner film on both sides of the third stack gate;

etching back the first interlayer insulating film, the first liner film, the second liner film, and the sacrificial film to expose upper surfaces of the first, second, and third stack gates;

removing the first interlayer insulating film formed on the second liner film between the second stack gates and on the second liner film on both sides of the third stack gate;

removing the sacrificial film and the second liner film;

etching an upper part of the first liner film to be lower than the third and fourth gate insulating films; and forming a second interlayer insulating film to form a first air gap between the first stack gates, a sidewall insulating film comprising a second air gap on the side surface of the third stack gate, and a third air gap between the first stack gate and the second stack gate.

18. The nonvolatile semiconductor memory device manufacturing method according to claim 17, wherein
an upper end of the first air gap is located at a position on the semiconductor substrate lower than the fourth gate insulating film.

19. The nonvolatile semiconductor memory device manufacturing method according to claim 17, wherein
the first stack gate of the memory cell transistor, the second stack gate of the select gate transistor, and the third stack gate of the peripheral transistor are formed in the same process.

* * * * *